United States Patent [19]
Hayes

[11] Patent Number: 5,754,009
[45] Date of Patent: May 19, 1998

[54] LOW COST SYSTEM FOR EFFECTING HIGH DENSITY INTERCONNECTION BETWEEN INTEGRATED CIRCUIT DEVICES

[75] Inventor: Robert Stephen Hayes, Lawndale, Calif.

[73] Assignee: Hughes Electronics, Los Angeles, Calif.

[21] Appl. No.: 530,038

[22] Filed: Sep. 19, 1995

[51] Int. Cl.$^6$ .................................................. G09G 3/10
[52] U.S. Cl. ..................... 315/169.3; 315/350; 257/429; 257/82; 257/84
[58] Field of Search ................ 315/169.1, 169.3, 315/350; 313/309, 351; 250/310, 370.01, 370.14; 257/429, 84, 79, 80, 82, 10

[56] References Cited

U.S. PATENT DOCUMENTS

| | | | |
|---|---|---|---|
| 3,970,887 | 7/1976 | Smith et al. | 313/309 |
| 4,307,507 | 12/1981 | Gray et al. | 29/580 |
| 4,513,308 | 4/1985 | Greene et al. | 357/55 |
| 4,629,882 | 12/1986 | Matsuda et al. | 250/211 J |
| 4,728,851 | 3/1988 | Lambe | 313/309 |
| 5,012,153 | 4/1991 | Atkinson et al. | 313/309 |
| 5,150,019 | 9/1992 | Thomas et al. | 315/350 |
| 5,173,634 | 12/1992 | Kane | 313/306 |
| 5,357,121 | 10/1994 | Miyashita et al. | 257/79 |
| 5,359,256 | 10/1994 | Gray | 313/169 |
| 5,491,339 | 2/1996 | Mitsui et al. | 250/310 |
| 5,572,041 | 11/1996 | Betsui et al. | 257/10 |

FOREIGN PATENT DOCUMENTS

| | | |
|---|---|---|
| A0 618468 | 10/1994 | European Pat. Off. |
| A4116711 | 11/1991 | Germany |
| W0A9115874 | 10/1991 | WIPO |

OTHER PUBLICATIONS

IEEE Transactions on Electron Devices, Charles A. Spindt, et al., vol. 36, No. 1 (Jan. 1989), pp. 225–227.
IEEE Vacuum Microelectronics, Greene, et al. (1989), IEDM 89–15, pp. 1.3.1–1.3.3 no month.
IEEE Experiemental Results on Gridded Arrays of Field Emission Tips, Howell, et al. (1989), pp. 20.2.1–20.3.3 no month.
IEEE Lateral Miniaturized Vacuum Devices, Busta, et al. (1989), pp. 20.4.1–20.4.4 no month.
IEEE Transactions on Electrical Devices, "Modeling and Fabricating Micro–Cavity Integrated Vacuum Tubes", Orvis, et al. (1989), pp. 2651–2657 no month.
IEEE Field Emission from Submicron Emitter Arrays, Sokolich, et al. (1990), pp. 7.4.1–7.4.4 no month.
Lateral Vacuum Microelectronic Logic Gate Design, *Micromech. Microeng.*, 1 (1991), pp. 126–134. no month.
"Science and Technology: Japan Eyes a New Screen", *The Economist* (Aug. 31, 1991), pp. 68–69.
"Field–Emitter Arrays for Vacuum Microelectronics", Spindt, et al., *IEEE Transactions on Electron Devices* (Oct. 1991, vol. 38, No. 10), pp. 2355–2363.

(List continued on next page.)

*Primary Examiner*—Robert Pascal
*Assistant Examiner*—Haissa Philogene
*Attorney, Agent, or Firm*—Gordon R. Lindeen, III; Michael W. Sales; Wanda K. Denson-Low

[57] ABSTRACT

An interfacing system adapted for use with integrated circuits and accompanying devices. The inventive system includes an array of field emissive devices (36) which emit an electrons in response to input signals from multiple first circuits (14) on a first substrate (16). The field emissive devices (36) are located on the first substrate (16). An array of detectors (38) on a second substrate (20) receive the electrons across a (gap 42) between the first substrate (16) and the second substrate (20). A potential difference in response to a source of potential (22) between the first substrate (16) and the second substrate (20) accelerates the electrons across the vacuum gap (42). The interfacing system (10) may be constructed with a diameter of less than ten micrometers. Hence, two substrates with multiple circuits may be interfaced with many thousands of parallel connections per square centimeter without the need for multiplexing.

19 Claims, 8 Drawing Sheets

OTHER PUBLICATIONS

"DC I-V characteristics of Field Emitter Triodes", Busta, et al., *IEEE Transactions on Electron Devices* (Nov. 1991, vol. 38, No. 11), pp. 2558–2562.

"Electrical and Thermal Modeling of a Gated Field Emission Triode", Su, et al., *IEEE* (1993), pp. 31.5.1–31.5.4 no month.

*IEEE*, A Progress Report on the Livermore Miniature Vacuum Tube Project, Orvis, et al., CH2637–7/89/0000–0529 (1989), pp. 20.3.1–20.3.3 no month.

LOW COST SYSTEM FOR EFFECTING HIGH DENSITY INTERCONNECTION BETWEEN INTEGRATED CIRCUIT DEVICES

BACKGROUND OF THE INVENTION

1. Field of Invention

This invention relates to connections between circuits. Specifically, the present invention relates to connections for transferring, signals between two integrated circuits or between an integrated circuit and an accompanying, device.

2. Description of the Related Art

Integrated circuits are used in a variety of demanding applications involving both digital and analog circuits. Such circuits include optical sensors and infrared imaging devices. The circuits are fabricated on a semiconductor substrate which together comprise what is commonly referred to as a 'chip'. For certain applications, there is a need to output multiple signal lines from a single chip. Large chips may have several hundred connections but, typically less that 500 due to lack of space along the edges for bonding techniques. For example, an array of energy detectors from an optical sensor or imaging device may contain many thousands of parallel signals. Moreover, parallel image processing chips and neural network computation devices will require tens of thousands of signal paths. However due to the limits of current conductor bonding techniques, extremely high density connections between such parallel signals and computational steps and between integrated circuits are impractical making signal access problematic.

One such current conductor bonding technique requires the bonding of wires to large pads placed along the periphery of a circuit chip. Due to size limitations of the wire bonding pads and accompanying wires, circuit connection densities are limited to less than two hundred connections per linear inch. That is, if pads are placed on 005" centers, a 2" square die is limited to 160 connections.

An alternative approach involves use of Indium bumps, raised deposits of Indium which afford an area for metallic contact. Indium bump spacing requirements provide for densities as high as 1000 connections per linear inch. Hence, on the 0.2" square die mentioned above, 40,000 connections may be permitted. However, Indium bump connections are difficult to align and are not completely reliable. Also, they cannot easily be reworked or repaired. Hence, this approach can be expensive, inefficient and therefore impractical.

Multiplexing is also used for standard chip to chip connections. Several parallel signal paths on one chip are often multiplexed into fewer paths to accommodate limitations in the above-identified connection methods. However, the received signals must often be demultiplexed on the next chip. Hence, this approach may lead to increased design complexity and cost, and force time constraints on the operational speed of the system.

Hence, a need remains in the art for a system or technique for effecting very high density connections between integrated circuit devices at low cost.

SUMMARY OF THE INVENTION

The need in the art is addressed by the chip to chip interconnection system of the present which provides for high density signal connections between combinations of integrated circuits and accompanying devices. The inventive system transforms chip outputs into beams of electrons. Electrons travel across a gap to a receiving circuit disposed on a second chip.

In a specific embodiment, a field emissive element is utilized to generate the beam of charged particles. Electric signals pass across a vacuum between the first substrate and the second substrate and are received by a diode connected to a receiver circuit on the second substrate. A bias source is provided to create potential difference between the first substrate and the second substrate to accelerate the electron beams therebetween.

A field gate electrode is placed in front of the field emissive element to cause electron emission. A semiconductor diode is used to receive the emitted electrons. This diode may be recessed to allow signal transfer to the opposite side of the receiving chip. Alternately, the field emission element may be recessed.

The cathode emissive devices may be constructed with a diameter of less than ten micrometers. Hence, two circuits or substrates may be interconnected with many thousands of parallel connections per square centimeter without multiplexing.

DESCRIPTION OF THE INVENTION

Figure 1:
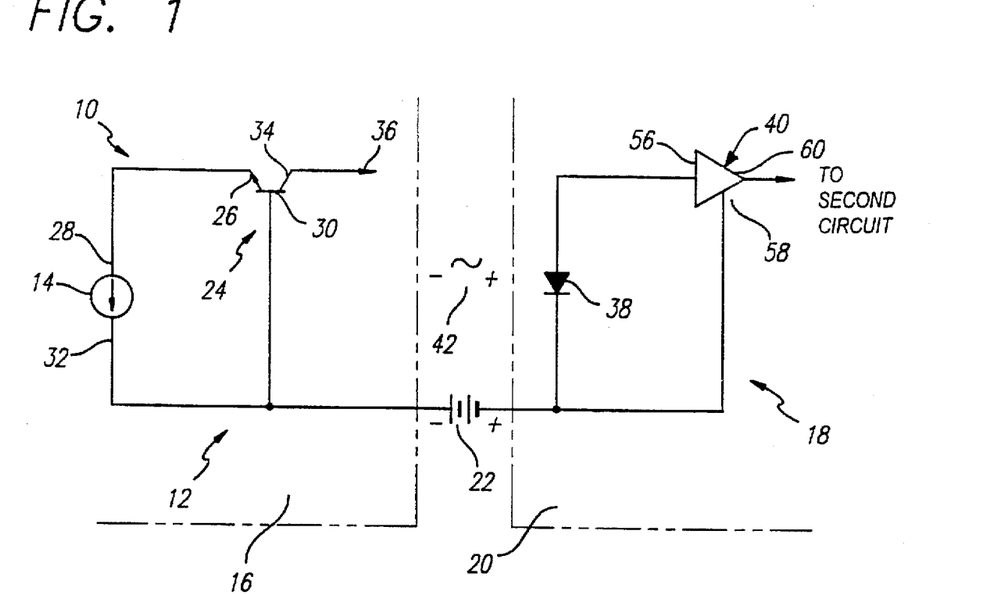
FIG. 1 is a schematic diagram of an illustrative implementation of a chip to chip interconnection system constructed in accordance with the teachings of the present invention.

FIG. 1 is a schematic diagram of an illustrative implementation of an interfacing system constructed in accordance with the teachings of the present invention. The system 10 includes a transmitting circuit 12 connected to a input circuit represented by a current source 14 disposed on a first substrate (shown in phantom) 16. The System 10 also includes a receiving circuit 18 disposed on a second substrate (shown in phantom) 20. The substrates 16 and 20 are physically separated from each other. A potential difference between the transmitting circuit 12 and the receiving circuit 18 is shown as a source of potential 22. The transmitting circuit 12 includes an npn bipolar junction drive transistor 24 having an emitter terminal 26 connected a first terminal 28 of the current source 14 and a base terminal 30 connected to a second terminal 32 of the current source 14. A collector terminal 34 of the drive transistor 24 is connected to a field emissive element 36 that in the preferred embodiment is implemented with a field emission cathode.

Field emissive elements were developed in an effort to construct miniature vacuum tubes. The devices were later adopted for applications such as flat panel displays, electron beam lithography, beam writing instruments, intermediate microwave power amplification, and medical diagnostic radiography. Field emissive elements may be obtained from such research facilities as Lawrence Livermore Labs, and SRI International. Field emissive elements may also be constructed as set forth in U.S. Pat. No. 4,307,507 to H. F. Gray and R. F. Green (1981) entitled METHOD OF MANUFACTURING A FIELD EMISSION CATHODE STRUCTURE, the teachings of which are incorporated herein by reference. A field emissive element 36 may also be sputter deposited onto the correct location on the collector terminal 34 of the transistor 24. Sputter depositing for forming field emissive elements is suggested in a paper by D. F. Howell, R. D. Groves, R. A. Lee, C. Patel, and H. A. Williams entitled EXPERIMENTAL RESULTS ON GRIDDED ARRAYS OF FIELD EMISSION TIPS (1989). Those skilled in the art will appreciate that other emissive devices may be used for this purpose without departing from the scope of the present invention.

Figure 2:
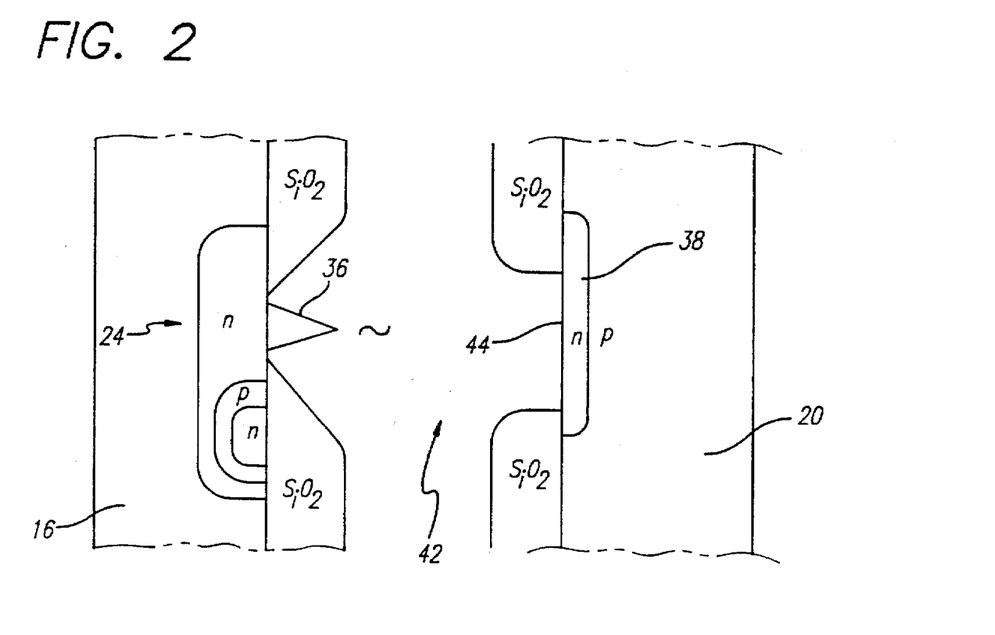
FIG. 2 is an illustrative device level diagram of the field emissive element of FIG. 1.

As shown in FIG. 2, the field emissive element 36 includes a tip of conductive material deposited on the collector terminal 34 of the transistor 24 which is a layer of n-type doping.

Returning to FIG. 1, the negative terminal on the source 22 is connected to a node between the second terminal 32 of the current source 14 and the base terminal 30 of the drive transistor 24.

The receiving circuit 18 includes a diode 38 having a cathode connected to an amplifier 40 and an anode connected to the positive terminal of the source 22. The silicon diode 38 is situated on the second substrate 20 (shown in phantom) closely adjacent to the field emissive element 36 on the first substrate 16. The diode may be implemented with a junction diode or a Schottky diode, of conventional design, other electron detector. A supply potential is applied to the amplifier 40 by the source 55 as well.

In operation, with reference to FIGS. 1 and 2, a signal to be transmitted from the circuit represented by the current source 14 is amplified by the drive transistor 24 and applied to the field emissive element 36. In response to the input from the drive transistor 24 and a potential applied by the source 22, a current flows from the field emissive element 36 across a gap 42, to the receiving diode 38. Electric current signals from the field emissive element 36, are transferred across the vacuum gap 42 as an electron beam. The current through the diode 38 is stimulated by receipt of the emitted current. The diode current is amplified and input to a second circuit (not shown in FIG. 1). In the preferred embodiment, the gap 42 is a hard vacuum to increase signal transfer performance, and extend the life of the field emissive element 36.

In the specific embodiment of FIG. 1, electrons are accelerated across the vacuum gap 42 by a 50 to 100 volt accelerating voltage supplied by the source 22. The transmitting circuit 12 is a common base transistor amplifier with an npn transistor 24.

FIG. 2 shows a surface 44 of the diode 38 that receives charges emitted from the transmitting circuit 12. To facilitate electron emission by the tip of the field emissive element 36, the distance between the surface 44 and the field emissive element 36 should be minimized. Greater spacing will require the field emissive structure shown in FIG. 3.

Figure 3:
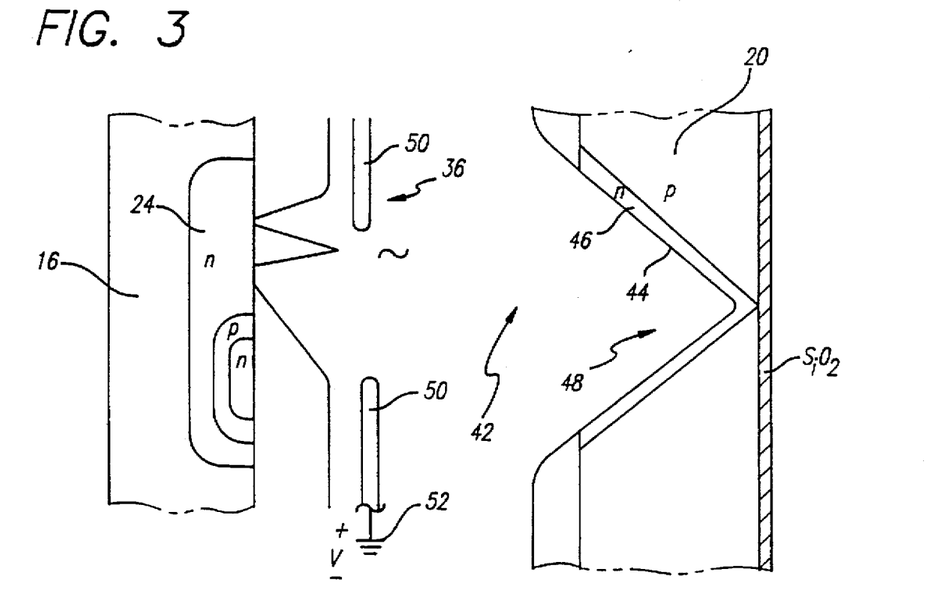
FIG. 3 is an alternative device level diagram of the illustrative embodiment of the device of FIG. 2.

FIG. 3 is an alternative device level diagram of the illustrative embodiment of the device of FIG. 2. The diode 38 (FIG. 1) is formed in a recess 48 etched in the semiconductor substrate 20. The recess 48 allows the electrons to reach the diode 38 fabricated on the opposite side of substrate 20. An optional gate electrode 50 is shown as a part of the field emissive element 36. If the width of the vacuum gap 42 between the first substrate 16 and the second substrate 20 is on the same order as the normal distance between the field emissive element 36 and the gate electrode 50, then the gate electrode 50 may not be needed. The larger accepting surface 44 enables the vacuum gap 42 to have a larger width, and still effectively receive signals. A gate potential 52 applied to the gate electrode 50 may be used to adjust the electric field around the tip of the field emissive element 36 in conjunction with the source of potential 22, and in turn vary the current transferred from the field emissive element 36 to the diode 38.

The density of the connections implemented with the embodiment FIG. 3 depends on the angle and depth of the recess 48. In the present illustrative embodiment, the recess 48 is assumed to be etched through the second substrate 20 to an n-type diffusion on the back of the second substrate 20. Assuming a substrate thickness of 0.01 centimeters, a large collection recess 48 having walls angled 45 degrees will have a 0.02 centimeter diameter at the surface. This allows for an approximate area connection density of 2500 connections per square centimeter. With steeper walls, connection densities may be higher. The area of the electron accepting surface 44 of the diode 38 may be approximately the same as the area of a field emissive element 36.

A typical field emissive element 36 is 10 micrometers in diameter. This equates to a possible area connection density of approximately 1,000,000 connections per square centimeter. Competing Indium bump technology is as much as thirty times less space efficient. The field emissive elements 20 have been fabricated with densities of nearly 10,000,000 tips per square centimeter in some devices which suggests that a much greater density is possible.

Figure 4:
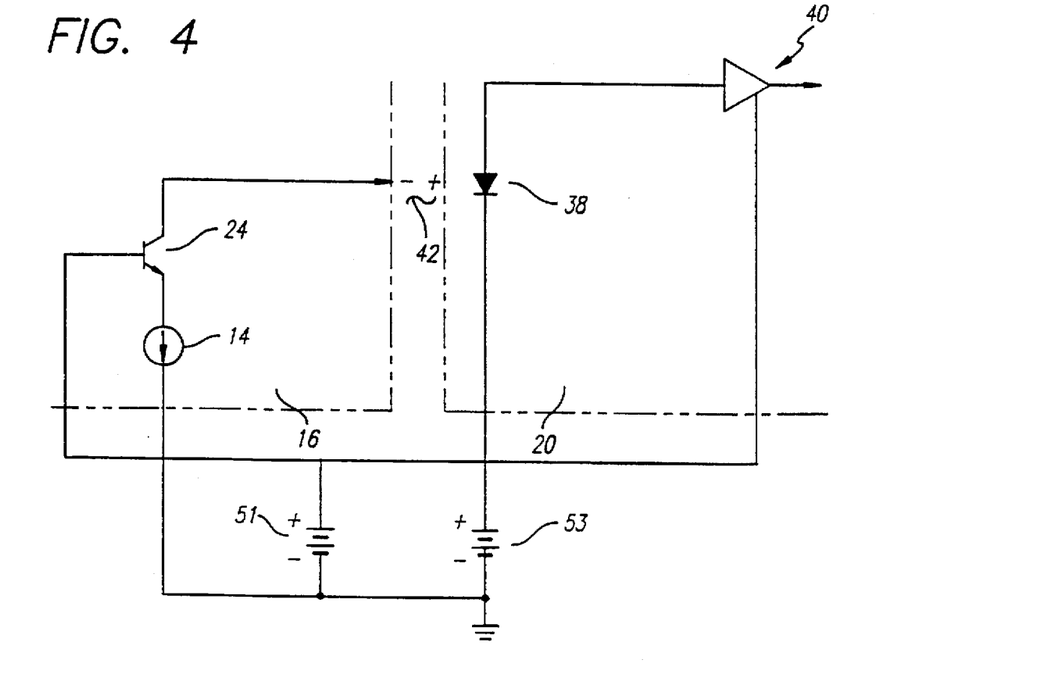
FIG. 4 is a schematic showing a first alternative embodiment of the present invention.

FIG. 4 is a schematic showing a first alternative embodiment of the present invention. The positive terminal of a power supply 51 is shown connected to the base of transistor 24, and to amplifier 40. Supply 51 powers and signal generating circuits (not shown) on substrate 16. In the present embodiment, power supply 51 is a five volt supply. The negative terminal of supply 51 is grounded. An accelerating voltage source 53 is used to set the potential on diode 38. The positive terminal of voltage source 53 is connected to the cathode of diode 38. The negative terminal is connected to ground. Accelerating voltage source 53, in conjunction with the collector voltage of transistor 24, may be adjusted in order to regulate current flow from field emissive element 36, and to regulate the current flow through diode 38. In the present embodiment, voltage source 53 provides sixty-five volts with respect to ground.

Figure 5:
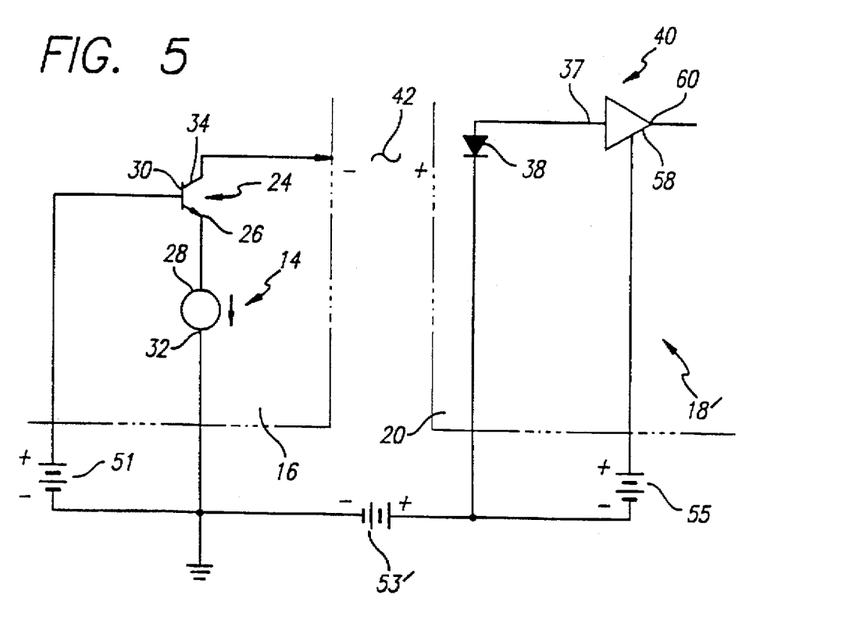
FIG. 5 shows a second alternative embodiment of the present invention.

FIG. 5 shows a second alternative embodiment of the present invention. The system in FIG. 5 is similar to the system in FIG. 4 with the exception that amplifier 40 is connected to the positive terminal of a five volt power supply 55 that is floating with respect to the accelerating voltage 53'. The negative terminal of supply 55 is connected to the positive terminal of accelerating voltage 53'.

Figure 6:
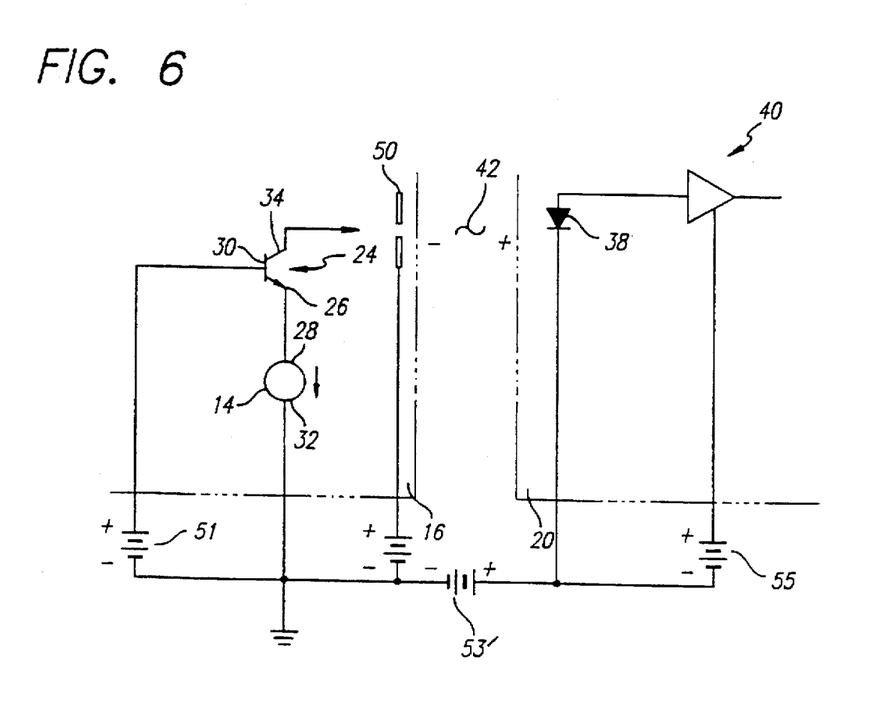
FIG. 6 shows a third alternative embodiment of the present invention with a gate electrode.

FIG. 6 shows a third alternative embodiment of the present invention. The system in FIG. 6 is similar to the system in FIG. 5 with the exception that gate electrode 50 is included. Gate electrode 50 is shown connected to the positive terminal of a source of gate potential 52. The negative terminal of the source of gate potential 52 is grounded. Gate potential 52 provides the electric field around the emissive element 36 necessary for electron emission, which in turn provides current flow from the emissive element 36 to diode 38 on substrate 20.

Figure 7:
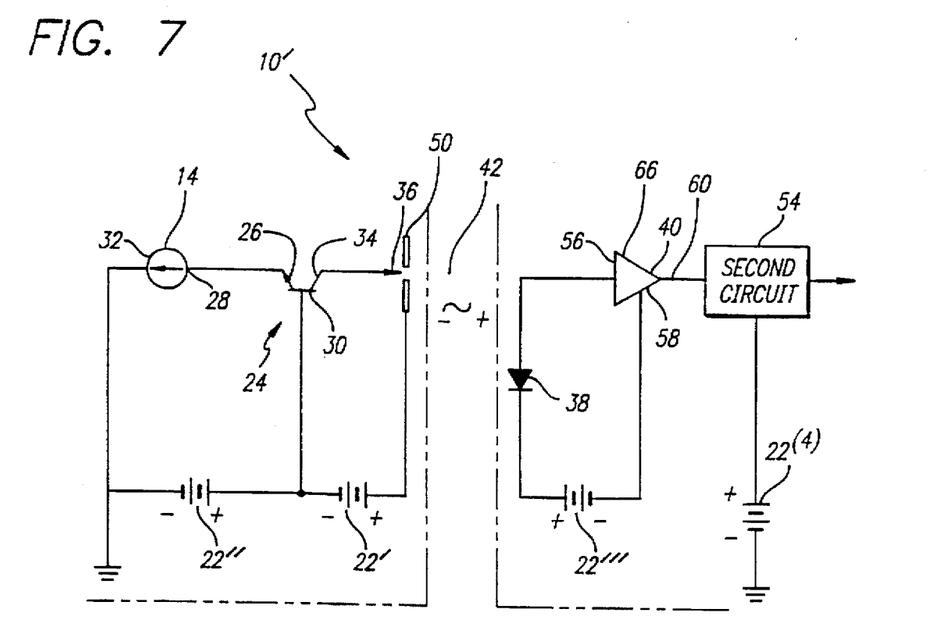
FIG. 7 shows a fourth alternative embodiment of the present invention with a gate electrode.

FIG. 7 is a fourth alternative embodiment of the system 10 of FIG. 1. The system 10' is similar to that of FIG. 1 with the exception of the gate electrode 50. The gate electrode 50 is placed directly in front of the field emissive element 36 that acts as a cathode element. Electrons are emitted from the field emissive element 36 under the influence of a first source of potential 22' electrically connected to the gate electrode 50. In the specific embodiment of FIG. 7, the first source of potential 22' places the gate electrode 50 at sixty-five volts (for example) with respect to ground. The base terminal 30 of drive transistor 24 is connected to a second source of potential 22". In this specific embodiment, the second source of potential 22" places the base terminal 30 at approximately five volts with respect to ground.

The emitter terminal 26 of drive transistor 24 is connected to the second terminal 18 of the current source 14. The first terminal 32 is connected to ground. The collector terminal 34 of transistor 24 is connected to and provides drive current to the field emissive element 36.

The diode 38 on the receiving circuit 18 receives signals as an electron beam from the field emissive element 36. The diode 38 then transfers the signals to the amplifier 40, which enhances and sends the signals to a second circuit 54 for further processing. The first diode terminal 35 is connected to a first amplifier terminal 56. The cathode of diode 38 is connected to a third source of potential 22'" that places the anode of diode 38 at approximately eighty to one hundred volts with respect to ground.

The second amplifier terminal 58 is connected to a fourth source of potential 22$^{(4)}$ that places the second amplifier terminal 58 at approximately five volts with respect to ground. In this specific embodiment, the fourth source of potential 22$^{(4)}$ is also connected to the second circuit 54 for providing power to the second circuit 54. A third amplifier terminal 60 is connected to the second circuit 54, providing the second circuit 54 with an output signal that has been transferred from the first substrate 16 (shown in phantom). By transmitting electric current signals across the gap 42 between the first substrate 16 (shown in phantom), and the second substrate 20 (shown in phantom), the interfacing system 10 of the present invention eliminates the need for a physical wire connection.

Figure 8:
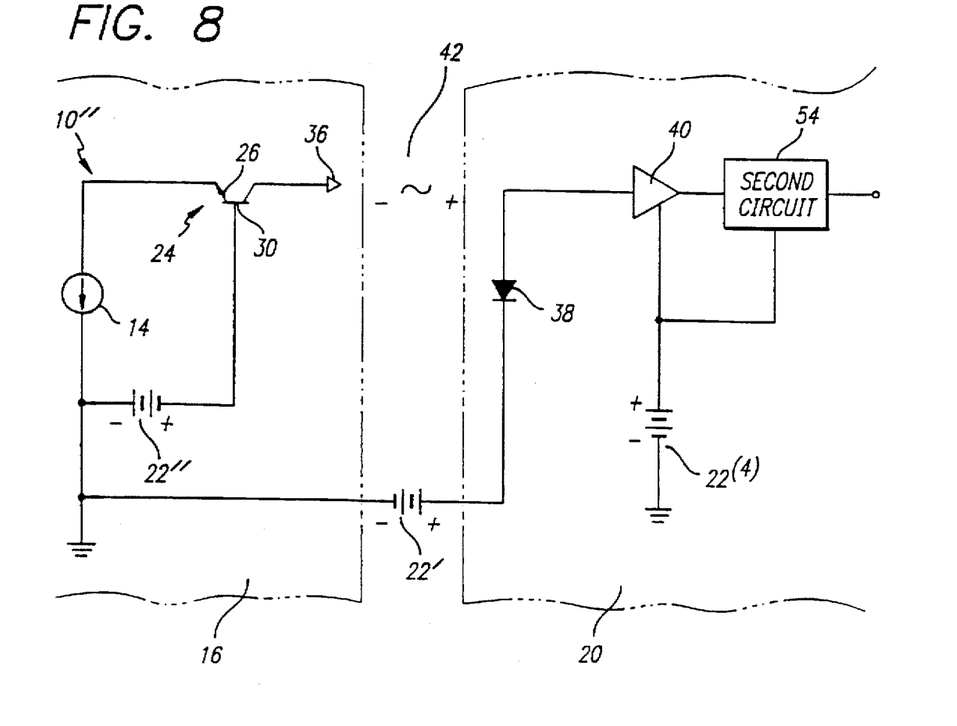
FIG. 8 is a fifth alternative embodiment of the present invention showing the interfacing system connected to a second circuit.

FIG. 8 is a fifth alternative embodiment of the present invention showing the interfacing system connected to a second circuit 54 without a gate electrode 50. FIG. 8 is similar to FIG. 7 with the exception of the gate electrode 50 which is not included and the arrangement of the bias potentials 22', 22" and 22$^{(4)}$, and the omission of bias potential 22'".

Figure 9:
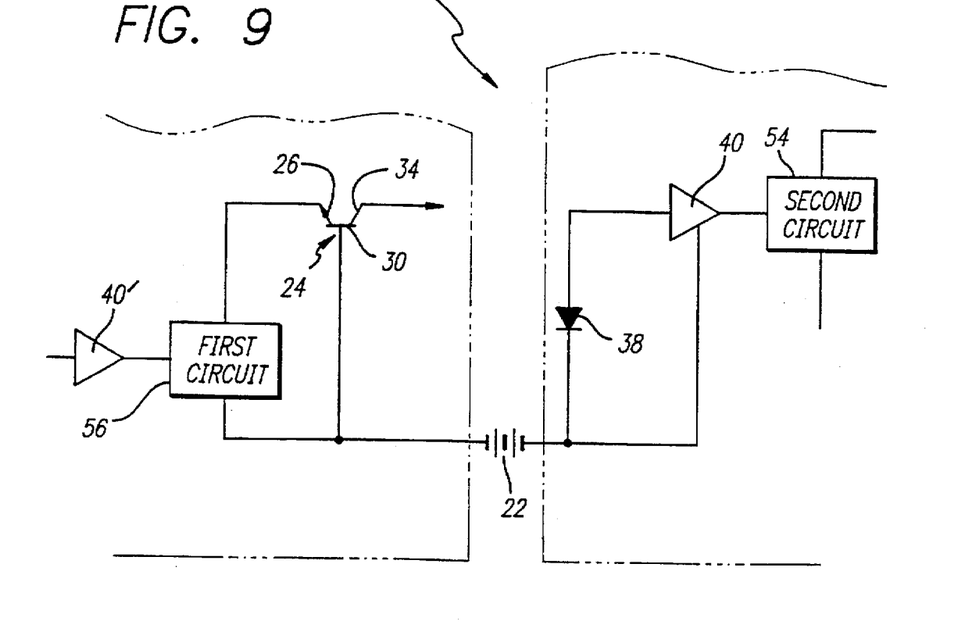
FIG. 9 is depicts a cascade arrangement utilizing the system of FIG. 1.

FIG. 9 is depicts a cascade arrangement of the system of the system of FIG. 1. The system 10" is similar to system 10 of FIG. 1 with the exception of the current source 14. The current source 14 is replaced by a first circuit 56 which is connected to an amplifier 40' (not shown) of a previous receiving circuit. The first circuit 56 represents a second circuit from a previous signal processing stage and supplies the electric signal to be transferred by system 10". Otherwise, system 10" transfers electric signals in the same manner as system 10.

Figure 10:
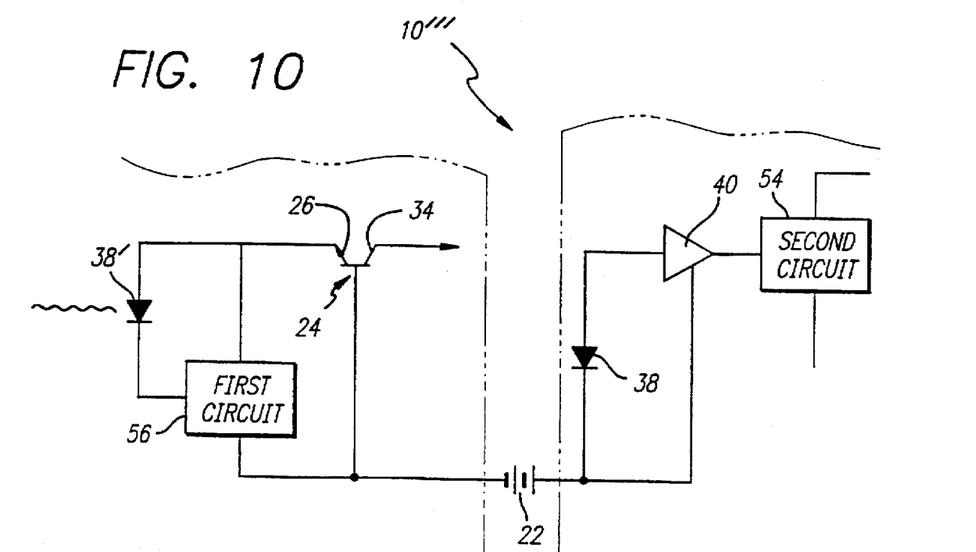
FIG. 10 is an alternative embodiment of the system of FIG. 9.

FIG. 10 is an alternative embodiment of the system of FIG. 9. The system 10'" is similar to system 10" of FIG. 9 with the exception of the amplifier 40'. The amplifier 40' is replaced by a diode 38' capable of receiving converting that beam into an electric current signal. The diode 38' may be a photodiode of general design such as diode 38. Otherwise, the system 10'" transfers electric signal in the same manner as system 10" of FIG. 8.

Figure 11:
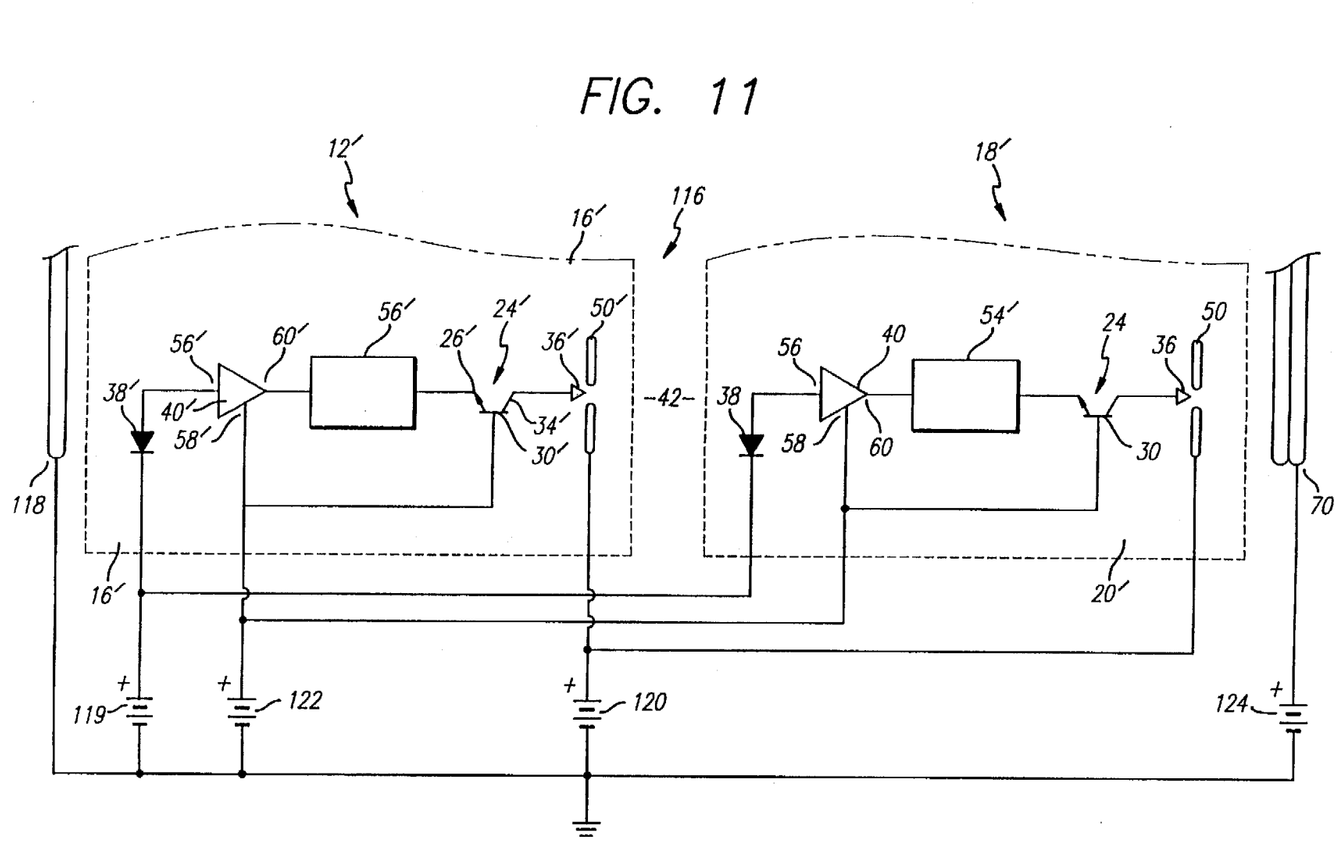
FIG. 11 is an illustrative embodiment depicting a cascade arrangement utilizing the third alternative embodiment of the present invention.

FIG. 11 is an illustrative embodiment depicting a cascade arrangement utilizing a third alternative embodiment of the present invention. Signals from a transmitting circuit 12' on a first substrate 16' are communicated to a receiving circuit 18' on a second substrate 20'. The transmitting circuit 12' receives signals from a photo emissive surface 118 placed in front of a photodiode 38' on the transmitting circuit 12'. Electromagnetic energy in the form of light causes the emission of electrons from photo emissive surface 118. Electrons are accelerated from the photo emissive surface 118 by a bias potential 119, and are detected by a diode 38' on the first substrate 16'. Current through diode 38' varies in response to electrons received from the photo-emissive surface 118. The photo emissive surface 118 may be deposited on a sheet of glass. The anode of diode 38' is connected to a first terminal 57' of an amplifier 40'. The cathode of photodiode 38' is connected to the positive terminal of a source of potential 119. Potential 119 biases the diode 38', and provides an accelerating potential for electrons emitted by photo emissive surface 118. In the present embodiment, potential 119 is placed at twenty to forty volts with respect to ground. Signals received by the photodiode 38' are amplified by amplifier 40', and sent as output to a third amplifier terminal 60'. The third amplifier terminal 60' is connected to a first circuit 56' that may be used as a first stage of signal processing. Output from circuit 56' is connected to an emitter 26' of a drive transistor 24'. A collector terminal 34' is connected to a field emissive element 36'. A gate electrode 50' is placed in front of the field emissive element 36'. The gate electrode 50' is connected to a gate potential 120. In the present specific embodiment, the gate potential 120 is placed at sixty-five volts with respect to ground. Gate potential 120 creates an electric field around the emissive tip 36' facilitating electron emission from the emissive tip 36'. The base 30' of transistor 24' is connected to a node between the second terminal 58' of amplifier 40' and a potential 122. In the present specific embodiment, potential 122 is a five volt potential, and powers amplifier 40'. Potential 122 also serves to bias transistor 24'. If gate potential 120 is sufficiently large, the amount of current emitted by the field emissive tip 36' maybe large is approximately equal to the amount of current in the emitter 26 of transistor 24. If a significant potential difference exists between bias potential 119 and potential 122, electrons emitted from the emissive tip 36' will have sufficient energy to create multiple electron-hole pairs in diode 38 in the receiving circuit 18', resulting in current gain.

The second circuit 18' functions in a similar manner to the transmitting circuit 12', with the exception that electric signals are received by diode 38 from the field emissive element 36'. On the first substrate 16', the diode 38' receives electrons generated by photo-emission. In addition, the receiving circuit contains a second circuit 54' in place of first circuit 56'. Second circuit 54' may be a second stage in signal processing. Current through diode 38 in the second circuit 18' varies in response to current signals received from the field emissive element 36'. The emissive element 36 emits electrons that are received by an electron sensitive device such as a phosphor screen 70. Gate electrode 50 is placed in front of the phosphor screen 70, and is connected to the node between gate electrode 50' and the positive terminal of the source of potential 120. Hence, gate electrode 50 and gate electrode 50' are placed at sixty five volts with respect to ground. Potential 120 stimulates the emission of electrons from the emissive element 36 on the receiving circuit to the phosphor screen 70. Electrons received by the phosphor screen 70 may be further accelerated by a screen potential 124 connected to the phosphor screen 70. The electrons striking the phosphor screen 70 cause the emission of light.

For the purpose of illustration, the cathode of diode 38 is shown connected to a node between the positive terminal of the sourced if potential 119, and the cathode of diode 38'. Hence, the cathodes of diode 38' and diode 38 are both at eighty to one hundred volts with respect to ground. The base terminal of transistor 30 is connected to a node between the second terminal 58 of amplifier 40, and the source of potential 122, and between the base terminal 30' of transistor 24'. Hence, transistors 24' and transistor 24 are biased by the five volt potential 122. Amplifier 40' and amplifier 40, are also powered by the same five volt potential 122.

Figure 12:
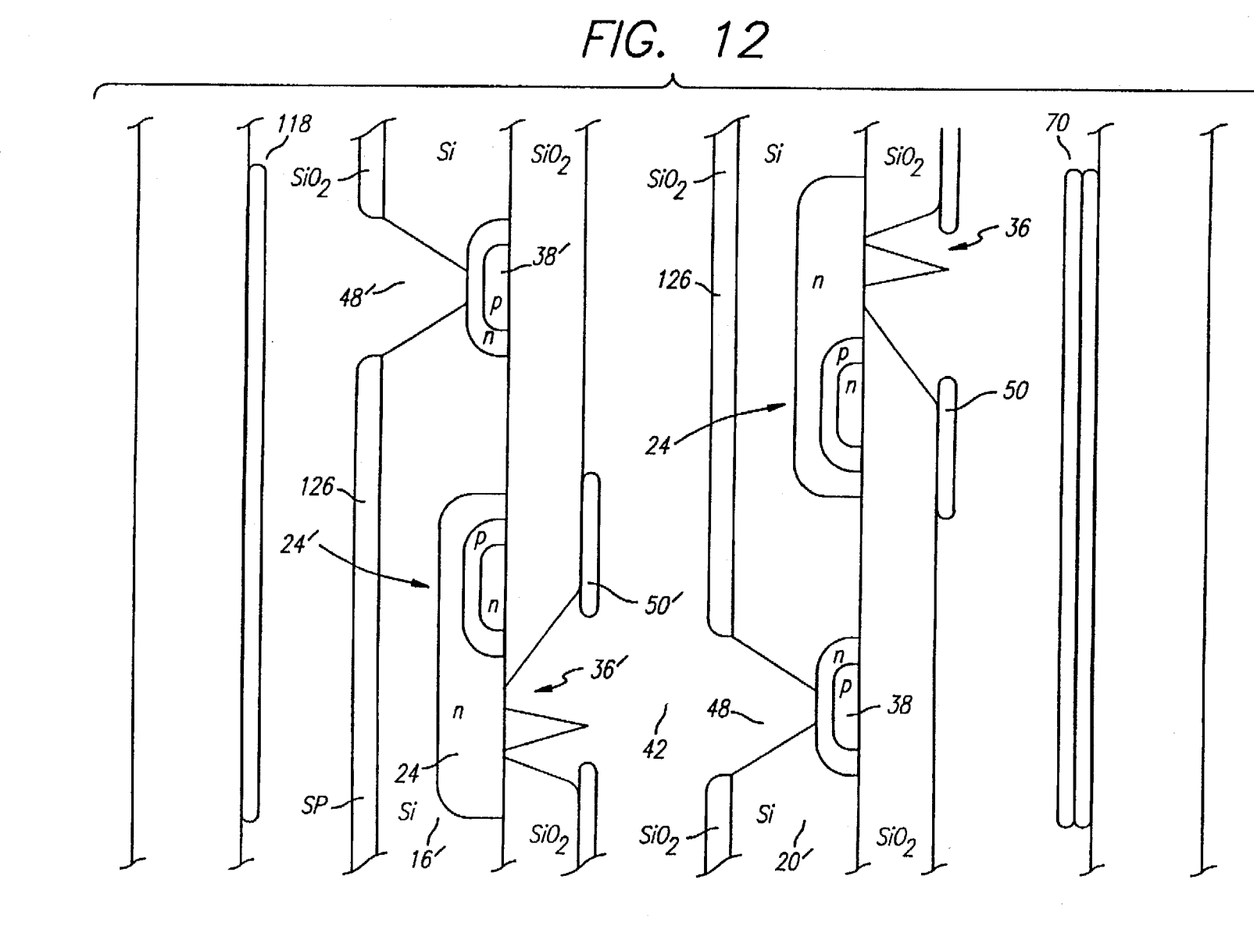
FIG. 12 is a device level illustration depicting the cascade arrangement of FIG. 11 constructed on vertically stacked substrates.

FIG. 12 is a device level illustration showing how the cascade arrangement of FIG. 11 may be a constructed on vertically stacked substrates. The photo emissive surface 118 emits electrons that are detected by photodiode 38' on the first substrate 16'. A recess 48' in the substrate is shown etched partially through substrate 16'. Recess 48' enables the photodiode 38' to detect electrons from the opposite side of the substrate 16'. Recess 48' is exposed to electrons through openings in a protective layer 126 of silicon dioxide that is deposited on the side of substrate 16'. This protective layer 126 insulates substrate 16' from unwanted signal transfer directly through the substrate 16' to transistor 24. Instead, electromagnetic signals from photo-emissive surface 118 are directed to diode 38'. Signals then become available at the opposite side of substrate 16', where the diode may then be easily connected to circuitry (not shown in FIG. 12) such as amplifier 40' and first circuit 56' shown in FIG. 11. The circuitry is in turn connected to transistor 24'. Transistor 24' is shown connected to field emissive element 36'. Gate electrode 50' is placed in front of the field emissive element 36', and operates as the system in FIG. 11.

The devices on substrate 20' function in a similar manner to the devices on substrate 16', with the exception that diode 38 on substrate 20' detects electric current signals from field emissive element 36'. Diode 38' on the substrate 16' detects light signals. Electrons emitted from the element 36' on the first substrate 16', pass across the vacuum 42 to diode 38 on the opposite side of the second substrate 20'. Signals are then processed by circuitry (not shown in FIG. 12) as such as that shown in FIG. 11 as receiving circuit 18', and emitted by field emissive element on the opposite side of substrate 20'. The signals are subsequently converted to light by the phosphor screen 70, and displayed as discussed in FIG. 11.

Figure 13:
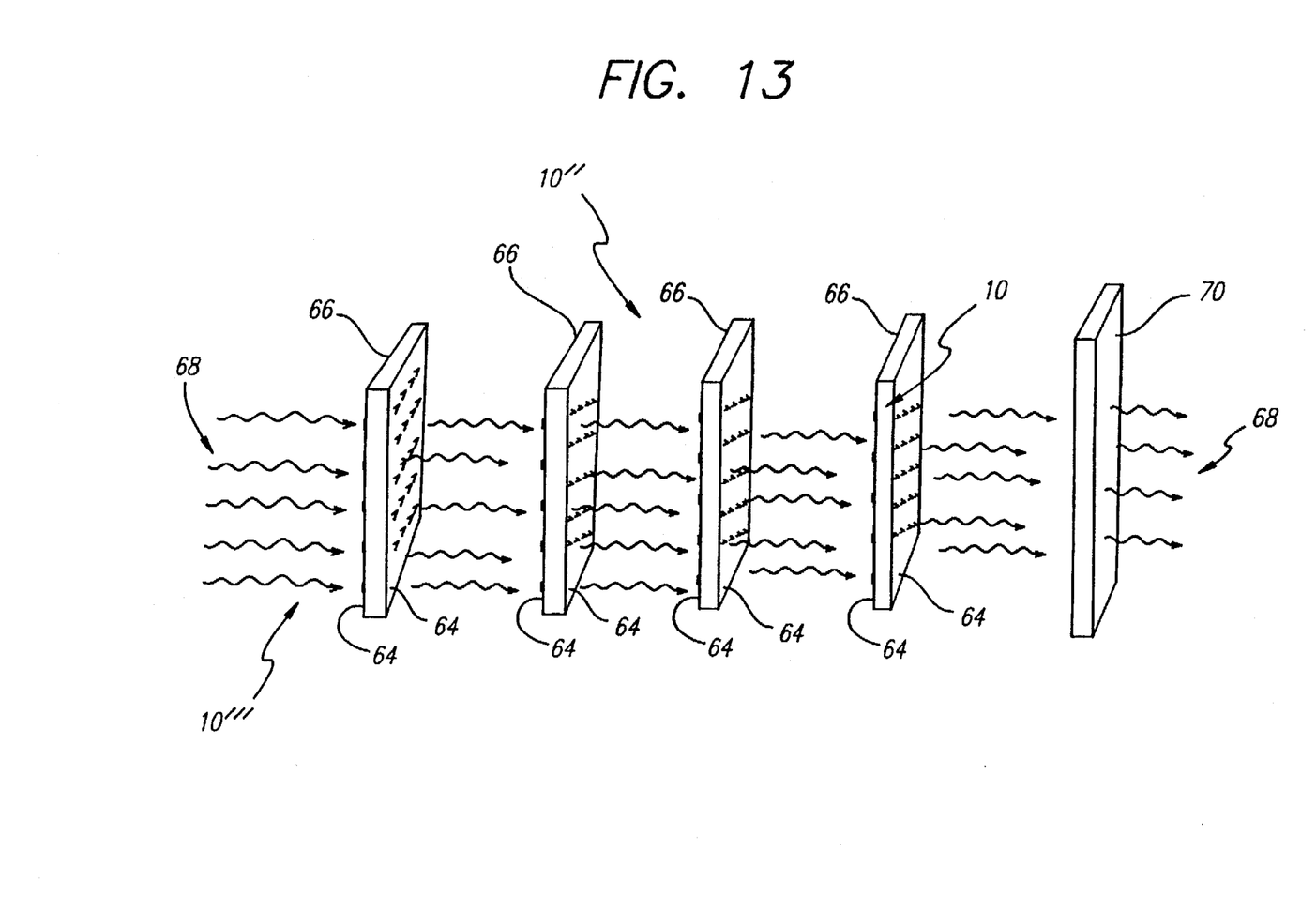
FIG. 13 is a diagram showing how the circuit interfacing system of the present invention may be used in a parallel processing device.

FIG. 13 is a diagram showing how the circuit interfacing systems 10' and 10''' of the present invention may be used in a parallel processing device 62. Circuit interfacing systems can be arranged in area arrays 64 for increasing connection densities. The emitter tips from a plurality of systems 10'' and 10''' are shown distributed in x-y arrays which in other embodiments may be rectangular, hexagonal, or another shape. The arrays are distributed over integrated circuit substrates which contain subsequent signal processing stages 66. Substrates with such arrays may be stacked. The chips are cascaded by fabricating detectors on one side and emitters on the other. Stacking facilitates utilizing area connection densities. The novel connectors of the present invention allow several circuit substrates to be stacked and subsequently combined in series. Such stacked substrates permit parallel pixel calculations for each pixel in an image 68. The image 68 is captured by a system 10''', and transferred between subsequent signal processing stages 66 by systems 10''. The final image 68 is transferred by a system 10 to a phosphor screen 70 for viewing.

One may also use the circuit interfacing systems of the present invention to perform summing operations. Signals to be summed may be aimed at the same diode 38 on the same receiving circuit 18. This results in analog signal summation. Signal gain may also be obtained. Electrons transferred across the vacuum gap 42 may create multiple electron-hole pairs within the adjacent diode 38 resulting in a desired current gain. Still further uses will become apparent from a consideration of the description and drawings.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications, and embodiments within the scope of the present invention.

Accordingly,

What is claimed is:

1. A system for connecting integrated circuit devices comprising:

a source of an analog input signal disposed on a first substrate;

first means for emitting a beam of electrically charged particles, wherein said first means is electrically connected to said source on said first substrate;

second means for receiving said beam; and third means electrically connected to said second means and disposed on a second substrate for outputting said input signal.

2. The invention of claim 1 wherein said beam of electrically charged particles is a beam of electrons.

3. The invention of claim 1 wherein said first means is a field emissive element.

4. The invention of claim 3 wherein said field emissive element is a cathode element.

5. The invention of claim 4 wherein said cathode element is fabricated as a tip of semiconductive material deposited on said first substrate.

6. The invention of claim 4 wherein said cathode element is fabricated as a tip of metal on said first substrate.

7. The invention of claim 4 wherein said cathode is connected to a drive transistor.

8. The invention of claim 7 wherein said drive transistor has three terminals: an emitter, a collector, and a base terminal, wherein the base is connected to a node between a first terminal of an input signal source and a first terminal of a source of potential; the emitter is connected to a second terminal of the input signal source, and the collector is directly connected to said field emissive element.

9. The invention of claim 1 wherein said means for receiving said beam is a diode.

10. The invention of claim 9 wherein said diode is used to amplify signals transferred via said beam.

11. The invention of claim 9 wherein said diode includes a recess in said second substrate.

12. The invention of claim 9 wherein the cathode of the diode is connected to a first terminal of an amplifier.

13. The invention of claim 9 wherein the anode of the diode is connected to a second terminal of an amplifier.

14. The invention of claim 13 wherein said amplifier has a third terminal.

15. The invention of claim 14 wherein said third terminal is electrically connected to said second circuit for providing a signal to said second circuit.

16. The invention of claim 1 including means for applying an electric field between said first and said second substrates.

17. The invention of claim 9 including a second diode electrically connected to said first means to couple an input signal from a second source to said first means.

18. A system for interconnecting integrated circuit devices comprising:

a first circuit disposed on a first substrate for providing an said input signal;

a drive transistor disposed on said first substrate for amplifying said input signal;

a field emissive element disposed on said first substrate and connected to said drive transistor for emitting a beam of charged particles in response to said input signal;

a diode for receiving said beam;

a second circuit disposed on a second substrate and electrically connected to said diode for outputting said input signal; and means for applying an electric field between said first and said second substrates whereby signals are transferred across a gap therebetween.

19. A system for connecting integrated circuit devices comprising:

a first means for emitting a beam of electrically charged particles, said first means including a cathode connected to a drive transistor having three terminals: an emitter, a collector, and a base terminal, wherein the base is connected to a node between a first terminal of an input signal source and a first terminal of a source of potential; the emitter is connected to a second terminal of the input signal source, and the collector is directly connected to said field emissive element, wherein said first means is electrically connected to a first circuit disposed on a first substrate and a second means for receiving said beam, said second means being electrically connected to a second circuit disposed on a second substrates.

* * * * *